(12) United States Patent
Hsu

(10) Patent No.: US 7,466,563 B2
(45) Date of Patent: Dec. 16, 2008

(54) FIXING STRUCTURE OF CIRCUIT BOARD

(75) Inventor: Yung-Chin Hsu, Taipei (TW)

(73) Assignee: Inventec Corporation (TW)

( * ) Notice: Subject to any disclaimer, the term of this patent is extended or adjusted under 35 U.S.C. 154(b) by 276 days.

(21) Appl. No.: 11/391,809

(22) Filed: Mar. 28, 2006

(65) Prior Publication Data

US 2007/0236905 A1    Oct. 11, 2007

(51) Int. Cl.
  *H05K 7/02*   (2006.01)
  *H05K 7/04*   (2006.01)

(52) U.S. Cl. .................. 361/810; 361/807; 361/804; 174/138 E; 174/138 D

(58) Field of Classification Search .......... 361/801, 361/802, 804, 807, 810, 760, 730, 748; 174/138 D, 174/138
See application file for complete search history.

(56) References Cited

U.S. PATENT DOCUMENTS

| | | | |
|---|---|---|---|
| 4,226,491 A * | 10/1980 | Kazama et al. | 439/76.1 |
| 5,400,216 A * | 3/1995 | Tsai | 361/684 |
| 6,377,445 B1 * | 4/2002 | Davis et al. | 361/683 |
| 6,781,055 B2 * | 8/2004 | Chen | 174/535 |
| 6,934,162 B2 * | 8/2005 | Perez et al. | 361/759 |
| 6,982,878 B2 * | 1/2006 | Chen et al. | 361/801 |
| 7,072,176 B2 * | 7/2006 | Lin et al. | 361/685 |
| 7,106,601 B2 * | 9/2006 | Chen et al. | 361/801 |
| 7,110,264 B2 * | 9/2006 | Chen et al. | 361/801 |
| 2004/0125575 A1 * | 7/2004 | Chen et al. | 361/759 |

* cited by examiner

*Primary Examiner*—Tuan T. Dinh
*Assistant Examiner*—Hung S Bui
(74) *Attorney, Agent, or Firm*—Peter F. Corless; Steven M. Jensen; Edwards Angell Palmer & Dodge LLP

(57) ABSTRACT

A fixing structure of a circuit board for fixing the circuit board in a case is proposed. The fixing structure includes a first limiting portion, a first fixing portion and a post of a first attaching portion retained in the case; and a second limiting portion, a second fixing portion and a second attaching portion formed on the circuit board. The second limiting portion and the second fixing portion are respectively located corresponding to the first limiting portion and the first fixing portion for preventing the circuit board and the case from moving to all directions. Furthermore, the second attaching portion can be attached to the first attaching portion to fix the positions of the circuit board and the case. By such arrangement, the number of locking elements can be decreased to reduce time consumed for assembly and detachment.

8 Claims, 2 Drawing Sheets

FIXING STRUCTURE OF CIRCUIT BOARD

FIELD OF THE INVENTION

The present invention relates to a fixing structure of a circuit board, and more particularly, to a fixing structure of a circuit board which can be applied to a motherboard case of an electronic device, such that the circuit board can be fixed on the fixing structure. The fixing structure is able to fix a circuit board or a similar product with a reduced number of screws or locking elements.

BACKGROUND OF THE INVENTION

Along with the blooming development of the technology, an electronic device has already become an essential part of daily life. One electronic device usually comprises a number of circuit boards (printed circuit boards) which are received in the case of the electronic device. The foregoing circuit board is fixed on a fixing device by a fixing method using a number of screws. Thus, such fixing method which requires a large number of screws is very complex in process and consumes a huge amount of time for assembly and detachment. Referring to FIG. 4, a prior-art fixing device 3 of a circuit board comprises at least three locking posts 31. Three screws can be received in three tapped holes of the circuit board to fix the circuit board on the fixing device 3, so as to achieve the fixation of the circuit board.

However, as the foregoing fixing device fixes the circuit board using a large number of screws and locking elements, it not only complicates the process of fixing the circuit board but also consumes a huge amount of time for assembly and detachment.

What is needed, therefore, is to provide a fixing structure to fix the circuit board on the fixing structure with a reduced number of locking elements, such that time consumed for assembly and detachment can be minimized.

SUMMARY OF THE INVENTION

In light of the above prior-art drawbacks, a primary objective of the present invention is to provide a fixing structure of a circuit board, by which a prior-art screw fixing method can be replaced by a clamping method, so as to eliminate a prior-art drawback that a huge amount of time is consumed for assembly and detachment due to a large number of locking elements.

Another objective of the present invention is to provide a fixing structure of a circuit board, which structure is very simple.

A further objective of the present invention is to provide a fixing structure of a circuit board, which structure can be easily operated.

In accordance with the above and other objectives, the present invention proposes a fixing structure of a circuit board for fixing the circuit board in a case. The fixing structure comprises a first limiting portion, a first fixing portion and a post of a first attaching portion retained in the case; and a second limiting portion, a second fixing portion and a second attaching portion formed on the circuit board. The second limiting portion and the second fixing portion are located respectively corresponding to the first limiting portion and the first fixing portion for preventing the circuit board and the case from moving to any direction. Further, the second attaching portion can be attached to the first attaching portion to fix the positions of the circuit board and the case.

Referring to the foregoing fixing structure, the first limiting portion can be a post and the second limiting portion can be a jack. In a preferred embodiment, the post comprises a head portion and a neck portion. The jack is designed to have a dimension corresponding to the dimension of the head portion and has a minified segment corresponding to the neck portion. Additionally, the head portion of the post can be pyramidal or spherical, and the neck portion of the post can be cylindrical.

The first fixing portion can be a fixing groove formed on one side of the case, and the second fixing portion can be a hook slip provided on same side of the circuit board. Preferably, a narrow segment is formed on one side of the fixing groove, and the thickness of the hook slip is designed according to the narrow segment.

The first attaching portion can be a locking post formed on a surface of the case, and the second attaching portion can be an opening formed on a corresponding position on the circuit board. Preferably, the locking post comprises a tapped hole, which can receive a screw to provide a locking function.

Referring to the fixing structure of the circuit board proposed in the present invention, when the circuit board is fixed on the fixing structure, the jack of the circuit board is firstly aligned to the post of the fixing structure. Then, the jack of the circuit board serves to receive the head portion of the post, such that the position of the jack is equivalent to the height of the neck portion of the post. When the circuit board is shifted towards a first moving direction by a user, the minified segment of the circuit board is able to block against the neck portion of the post. Furthermore, the hook slip of the circuit board is received in the narrow segment of the fixing groove. Also, the opening of the circuit board automatically aligns to the locking post of the fixing structure. Thus, the circuit board can be fixed on the fixing structure without any horizontal movement. Lastly, the opening of the circuit board serves to receive a bolt to completely fix the circuit board on the fixing structure. During the detachment, the bolt can be rotated and the circuit board can be shifted towards a second moving direction, such that the circuit board can be detached using a simple process.

Referring to a prior-art fixing method, a large number of screws are used to fix the circuit board. Such method which requires a large number of screws not only complicates the process but also consumes a huge amount of time for assembly and detachment.

Accordingly, referring to the fixing structure of a circuit board proposed in the present invention, a fixing groove is formed on one side of the fixing structure for fixing the circuit board, so as to eliminate a prior-art drawback that a huge amount of time is consumed for assembly and detachment due to a large number of screws. Also, as the structure is simple and only one side of the structure is formed with the fixing groove, the drawback of the complicated design of the prior-art fixing structure can be eliminated.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention.

Figure 2:
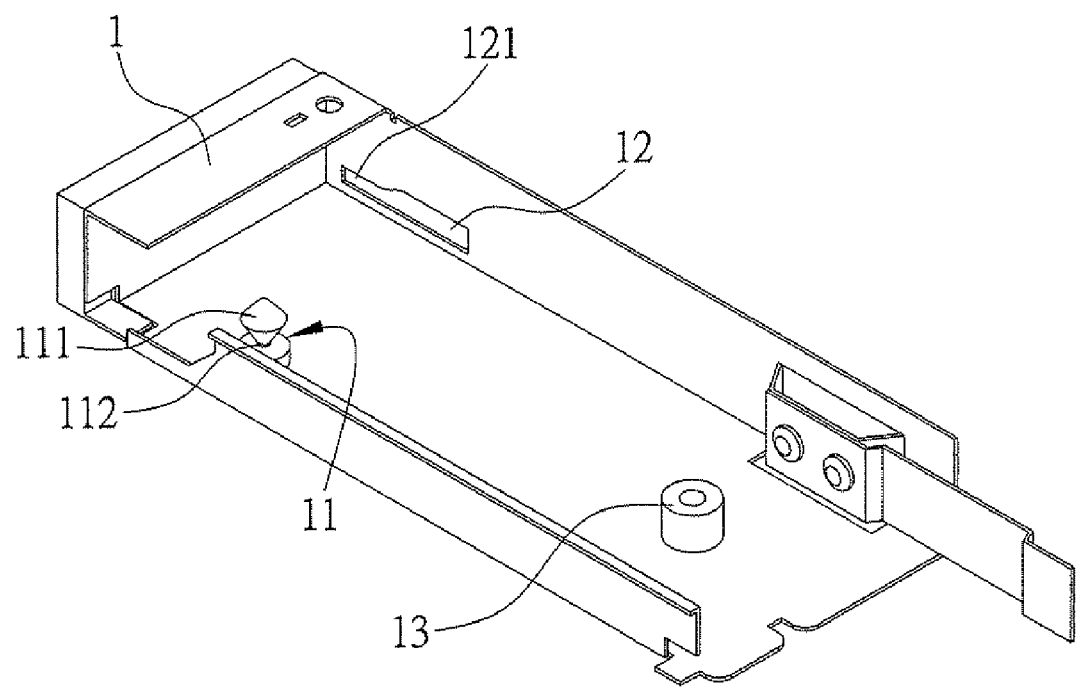
FIG. 2 is a representative diagram showing a fixing structure of a circuit board according to the present invention.

FIG. 2 is a representative diagram showing a fixing structure 1 of a circuit board 2 according to the present invention. Referring to FIG. 2, the fixing structure 1 of the circuit board 2 is received in a case of an electronic device and functions to fix the circuit board 2 on the fixing structure 1. The fixing structure 1 comprises a post 11 fixed on the fixing structure 1; at least a fixing groove 12 formed on one side of the fixing structure 1; and a locking post 13 fixed on the fixing structure 1. Thus, the number of locking elements can be reduced by the provision of the fixing groove 12. Therefore, the circuit board 2 can be fixed on the fixing structure 1 while reducing time consumed for assembly and detachment.

Moreover, referring to FIG. 2, the post 11 of the fixing structure 1 comprises a head portion 111 and a neck portion 112, wherein the head portion 111 can be pyramidal or spherical and the neck portion 112 can be cylindrical. The post 11 is a thermal welding element. Furthermore, the locking post 13 is fixed on the fixing structure 1 by welding. The interior of the locking post 13 is formed with internal threads, and the fixing groove 12 is formed on the fixing structure 1 by punching. The fixing groove 12 comprises a narrow segment 121 for locking a hook slip 22 of the circuit board 2. The fixing structure is simplified.

Figure 1:
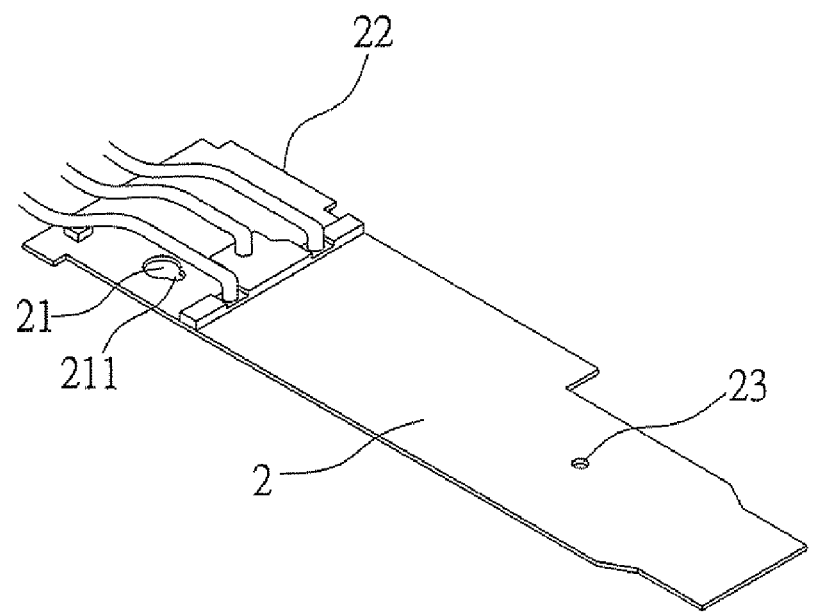
FIG. 1 is a plane view of a circuit board according to the present invention.

FIG. 1 is a plane view of a circuit board 2 according to the present invention. The circuit board 2 comprises a jack 21 for receiving the post 11; a hook slip 22 for locking a fixing groove 12 of the fixing structure 1; and an opening 23 for receiving a bolt 4.

Figure 3:
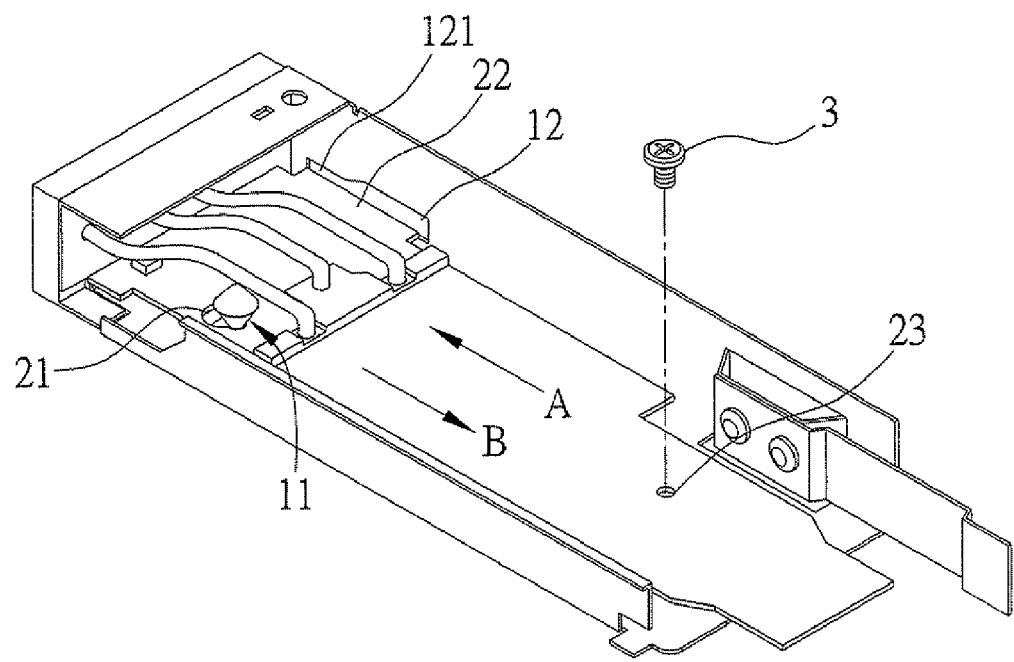
FIG. 3 is a schematic diagram showing a fixing structure of a circuit board being fixed on the circuit board according to the first preferred embodiment of the present invention.
Figure 4:
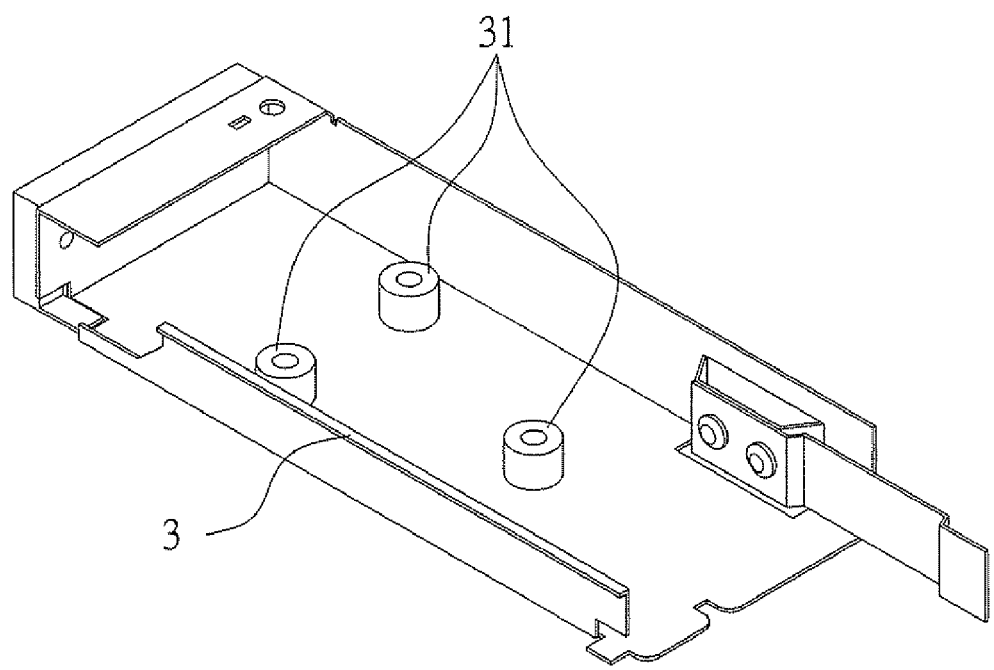
FIG. 4 is a diagram showing a fixing device according to the prior-art.

FIG. 3 is a schematic diagram showing a fixing structure 1 of a circuit board 2 being fixed on the circuit board 2 according to the first preferred embodiment of the present invention. When the circuit board 2 is fixed on the fixing structure 1, the jack 21 of the circuit board 2 is firstly aligned to the post 11 of the fixing structure 1. Then, the jack 21 of the circuit board 2 serves to receive the head portion 111 of the post 11, such that the position of the jack 21 is equivalent to the height of the neck portion 112 of the post 11. When the circuit board 2 is shifted towards a first moving direction A by a user, a minified segment 211 of the circuit board 2 is able to block against the neck portion 112 of the post 11. Furthermore, the hook slip 22 of the circuit board 2 is received in the narrow segment 121 of the fixing groove 21. Also, the opening 23 of the circuit board 2 automatically aligns with the locking post 13 of the fixing structure 1. Thus, the circuit board 2 can be fixed on the fixing structure 1 without any horizontal movement. Lastly, the opening 23 of the circuit board 2 serves to receive a bolt to completely fix the circuit board 2 on the fixing structure 1.

During the detachment, the bolt can be rotated and the circuit board 2 can be shifted towards a second moving direction B, such that the circuit board 2 can be detached by a simple process.

Accordingly, the fixing structure 1 of the circuit board 2 proposed in the present invention is able to reduce the number of locking elements and eliminate a prior-art drawback that a huge amount of time is consumed for assembly and detachment. The fixing structure is very simple and can be operated easily, and thus is high in utilization value.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fixing structure of a circuit board for fixing the circuit board in a case, the fixing structure comprising:

a first limiting portion, a first fixing portion and a post of a first attaching portion retained in the case; and a second limiting portion, a second fixing portion and a second attaching portion formed on the circuit board, wherein the second limiting portion and the second fixing portion are respectively located corresponding to the first limiting portion and the first fixing portion for preventing the circuit board and the case from moving to all directions, and the second attaching portion can be attached to the first attaching portion to fix positions of the circuit board and the case, wherein the first fixing portion is a fixing groove formed on one side of the case, and the second fixing portion is a hook slip provided on the same side of the circuit board, and a narrow segment is formed on one side of the fixing groove, and the thickness of the hook slip is designed according to the narrow segment.

2. The fixing structure of the circuit board of claim 1, wherein the first limiting portion can be a post and the second limiting portion can be a jack.

3. The fixing structure of the circuit board of claim 2, wherein the post comprises a head portion and a neck portion, and the jack is designed to have a dimension according to the dimension of the head portion and comprises a minified segment according to the dimension of the neck portion.

4. The fixing structure of the circuit board of claim 3, wherein the head portion of the post can be pyramidal or spherical.

5. The fixing structure of the circuit board of claim 3, wherein the neck portion of the post is cylindrical.

6. The fixing structure of the circuit board of claim 1, wherein the first attaching portion can be a locking post formed on a surface of the case, and the second attaching portion can be an opening formed on a corresponding position on the circuit board.

7. The fixing structure of the circuit board of claim 6, wherein the locking post comprises a tapped hole, which can receive a locking element to provide a locking function.

8. The fixing structure of the circuit board of claim 7, wherein the locking element is a screw.

* * * * *